(12) United States Patent
Rudolph et al.

(10) Patent No.: US 7,476,419 B2
(45) Date of Patent: *Jan. 13, 2009

(54) METHOD FOR MEASUREMENT OF WEIGHT DURING A CVI/CVD PROCESS

(75) Inventors: James W. Rudolph, Colorado Springs, CO (US); David E. Daws, San Pedro, CA (US); Dary Zeigler, Sun City, CA (US); Afshin Bazshushtari, Rolling Hills Estates, CA (US)

(73) Assignee: Goodrich Corporation, Charlotte, NC (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/698,227

(22) Filed: Jan. 25, 2007

(65) Prior Publication Data

US 2007/0227783 A1    Oct. 4, 2007

Related U.S. Application Data

(60) Continuation-in-part of application No. 10/776,395, filed on Feb. 11, 2004, now abandoned, and a continuation-in-part of application No. 10/658,988, filed on Sep. 9, 2003, which is a division of application No. 09/933,465, filed on Aug. 20, 2001, now Pat. No. 6,669,988, which is a continuation of application No. 09/178,399, filed on Oct. 23, 1998, now abandoned.

(51) Int. Cl.
*C23C 16/26* (2006.01)
*G01G 19/00* (2006.01)

(52) U.S. Cl. .............................. 427/249.2; 427/255.12; 427/255.7; 427/900; 177/245

(58) Field of Classification Search .................... 427/8, 427/9, 248.1, 249.2, 255.12, 255.7, 900; 118/712, 715, 725, 708; 177/1, 25.11, 25.13, 177/199, 200, 50, 245
See application file for complete search history.

(56) References Cited

U.S. PATENT DOCUMENTS 3,895,084 A * 7/1975 Bauer ...................... 156/89.26

(Continued)

FOREIGN PATENT DOCUMENTS

DE    39 22 539 A1    1/1991

(Continued)

OTHER PUBLICATIONS

European Search Report for EPO 99 12 0704; Search completion date Nov. 30, 2000; 2 pages.

(Continued)

*Primary Examiner*—Randy W Gibson
(74) *Attorney, Agent, or Firm*—Brinks Hofer Gilson and Lione

(57) ABSTRACT

A method of chemical vapor infiltration and deposition includes stacking a number of porous structures in a stack in a furnace. The stack has a center opening region extending through the porous structures and an outer region extending along the porous structures. A first portion of a reactant gas is introduced to the center opening region. A second portion of the reactant gas is introduced to the outer region. The first portion and the second portion are controlled proportions thereby introducing predetermined portions of the reactant gas to both the center opening region and the outer region. The change in weight of the entire furnace, including contents, is measured during the chemical vapor infiltration and deposition process. The rate of weight change is monitored.

19 Claims, 9 Drawing Sheets

U.S. PATENT DOCUMENTS

| | | | |
|---|---|---|---|
| 3,991,248 A * | 11/1976 | Bauer | 442/148 |
| 4,029,829 A * | 6/1977 | Weaver et al. | 427/590 |
| 4,044,920 A * | 8/1977 | Swartzendruber | 222/58 |
| 4,134,360 A * | 1/1979 | Fisher et al. | 118/728 |
| 4,212,906 A * | 7/1980 | Fisher et al. | 427/237 |
| 4,217,785 A * | 8/1980 | Spoor | 73/766 |
| 4,369,031 A * | 1/1983 | Goldman et al. | 432/198 |
| 4,375,838 A * | 3/1983 | Yano et al. | 177/50 |
| 4,457,967 A * | 7/1984 | Chareire et al. | 428/212 |
| 4,580,524 A * | 4/1986 | Lackey et al. | 118/725 |
| 4,606,650 A | 8/1986 | Harris | |
| 4,895,108 A * | 1/1990 | Caputo et al. | 118/728 |
| 4,964,734 A * | 10/1990 | Yoshida et al. | 374/14 |
| 5,190,913 A * | 3/1993 | Higashiyama et al. | 118/690 |
| 5,250,323 A * | 10/1993 | Miyazaki | 427/255.39 |
| 5,252,134 A * | 10/1993 | Stauffer | 118/726 |
| 5,256,162 A | 10/1993 | Drowley et al. | |
| 5,262,356 A | 11/1993 | Fuji | |
| 5,269,847 A | 12/1993 | Anderson et al. | |
| 5,281,295 A | 1/1994 | Maeda et al. | |
| 5,322,568 A | 6/1994 | Ishihara et al. | |
| 5,348,774 A * | 9/1994 | Golecki et al. | 427/543 |
| 5,352,484 A | 10/1994 | Bernard et al. | |
| 5,362,228 A | 11/1994 | Vaudel | |
| 5,391,232 A | 2/1995 | Kanai et al. | |
| 5,439,715 A | 8/1995 | Okamura et al. | |
| 5,470,390 A | 11/1995 | Nishikawa et al. | |
| 5,480,678 A | 1/1996 | Rudolph et al. | |
| 5,503,254 A | 4/1996 | Fisher et al. | |
| 5,556,475 A | 9/1996 | Besen et al. | |
| 5,625,170 A | 4/1997 | Poris | |
| 5,626,680 A | 5/1997 | Porter et al. | |
| 5,747,096 A * | 5/1998 | Golecki et al. | 427/8 |
| 5,770,823 A * | 6/1998 | Piroozmandi | 177/1 |
| 5,853,485 A | 12/1998 | Rudolph et al. | |
| 5,900,297 A * | 5/1999 | Rudolph et al. | 428/66.2 |
| 5,904,957 A * | 5/1999 | Christin et al. | 427/248.1 |
| 5,941,090 A | 8/1999 | Knutson et al. | |
| 6,057,022 A | 5/2000 | Purdy et al. | |
| 6,109,209 A | 8/2000 | Rudolph et al. | |
| 6,450,117 B1 | 9/2002 | Murugesh et al. | |
| 6,534,115 B2 * | 3/2003 | Gallagher et al. | 427/8 |
| 6,572,371 B1 | 6/2003 | Sion et al. | |
| 6,780,462 B2 | 8/2004 | Purdy et al. | |
| 6,942,893 B2 * | 9/2005 | Delperier et al. | 427/237 |
| 6,953,605 B2 | 10/2005 | Sion et al. | |
| 7,335,397 B2 | 2/2008 | Rudolph et al. | |

FOREIGN PATENT DOCUMENTS

| | | |
|---|---|---|
| EP | 0 223 642 B1 | 12/1988 |
| EP | 0 592 239 A1 | 4/1992 |
| EP | 0 548 944 A1 | 6/1992 |
| EP | 832863 A2 | 4/1998 |
| JP | 59054944 | 3/1984 |
| JP | 62-166353 | 1/1986 |
| JP | 63 295476 | 12/1988 |
| JP | 4 108680 | 4/1992 |
| NL | 8202882 | 2/1984 |
| WO | WO 87/04733 | 8/1987 |
| WO | WO 88/10245 | 12/1988 |

OTHER PUBLICATIONS

W.V. Kotlensky; Deposition of Pyrolytic Carbon in Porous Solids; 8 Chemistry and Physics of Carbon, 173, 190-203 (1973).

W. J. Lackey, *Review, Status, and Future of The Chemical Vapor Infiltration Process for Fabrication of Fiber-Reinforced Ceramic Composites*, Ceram, Eng. Sci., Proc., No. 10 (7-8), pp. 577-584, 1989.

A. J. Caputo and W.J. Lackey, *Fabrication of Fiber-Reinforced Ceramic Composites by Chemical Vapor Infiltration*, Oak Ridge National Laboratory, pp. 1-14, 1984.

D.P. Stinton, A.J. Caputo, R.A. Lowden, and T.M. Besmann, *Improved Fiber-Reinforced SiC Composites Fabricated by Chemical Vapor Infiltration*, The American Ceramic Society, Inc., pp. 982-989, 1986.

O. Vohler, P.L. Reiser and E. Sperk, *Deposition of Pyrolytic Carbon in the Pores of Graphite Bodies*, pp. 397-405, vol. 6, Carbon 1968.

M. L. Lieberman and H.O. Pierson, *Effect of Gas Phase Conditions on Resultant Matriz Pyrocarbons in Carbon/Carbon Composites*, pp. 233-241, vol. 12, Carbon 1974.

T.D. Gulden, J.L. Kaae, and K.P. Norton, *Forced-Flow Thermal-Gradient Chemical Vapor Infiltration (CVI) of Ceramic Matrix Composites*, pp. 546-552, Electrochemical Society 1990.

S. Kimura, N. Takase, S. Kasuya, and E. Yasuda, *Fracture Behaviour of C Fiber/CVD C Composite*, Research Laboratory of Engineering Materials, pp. 617-620, 1980.

Alan S. Brown, *Faster Production Processes Cut CCC Costs*, Aerospace America, pp. 18-19, Nov. 1994.

W. V. Kotlensky, *Deposition of Pyrolytic Carbon in Porous Solids*, Chemistry and Physics of Carbon, pp. 173-262, vol. 9, 1973.

Morton L. Lieberman, Richard M. Curlee, Floyd H. Braaten, and George T. Noles, *CVD/PAN Felt Carbon/Carbon Composites*, Composite Materials, pp. 337-348, vol. 9. Oct. 1975.

* cited by examiner

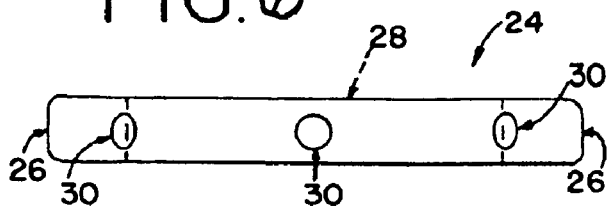
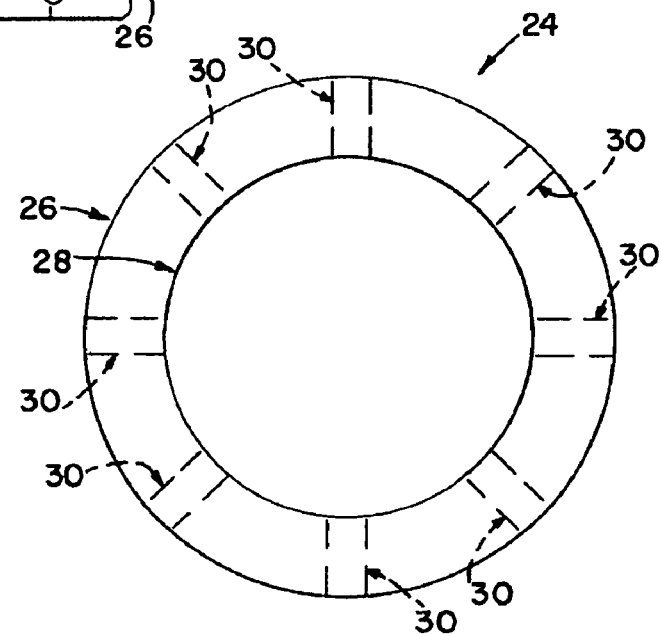
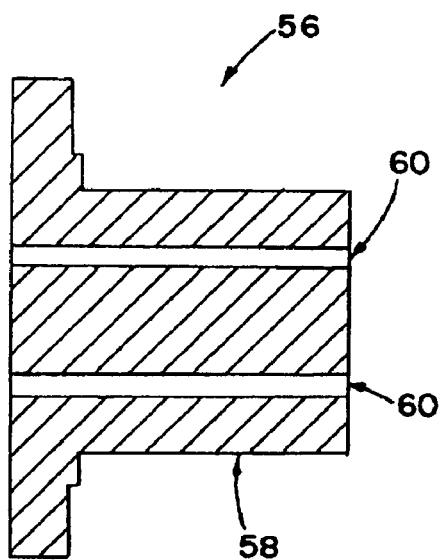
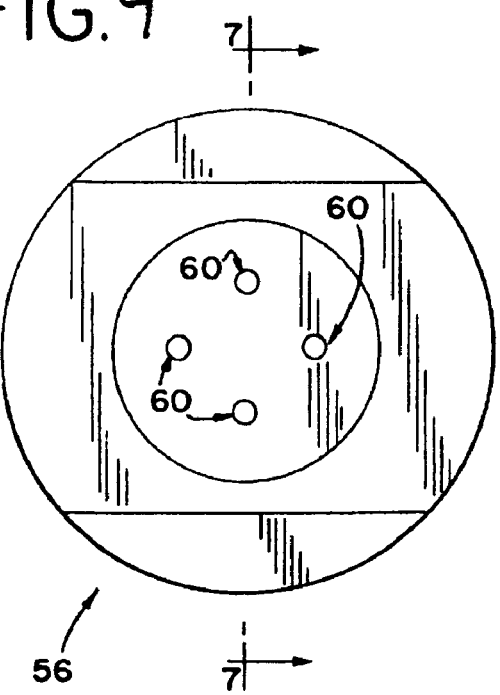

METHOD FOR MEASUREMENT OF WEIGHT DURING A CVI/CVD PROCESS

RELATED APPLICATIONS

The present patent document is a continuation-in-part of application Ser. No. 10/776,395 filed Feb. 11, 2004, now abandoned which is a continuation of application Ser. No. 09/178,399, filed Oct. 23, 1998, now abandoned; and a continuation-in-part of application Ser. No. 10/658,988 filed Sep. 9, 2003, which is a division of application Ser. No. 09/933,465, filed Aug. 20, 2001, now U.S. Pat. No. 6,669,988. All of the foregoing applications are hereby incorporated by reference.

FIELD OF THE INVENTION

This invention is in the field of Chemical vapor infiltration and Chemical vapor deposition (CVI/CVD). More specifically, this invention is directed to a method of weighing parts being subjected to the CVI/CVD process, during the process itself.

BACKGROUND

Chemical vapor infiltration and deposition (CVI/CVD) is a well known process for depositing a binding matrix within a porous structure. The term "chemical vapor deposition" (CVD) generally implies deposition of a surface coating, but the term is also used to refer to infiltration and deposition of a matrix within a porous structure. As used herein, the term CVI/CVD is intended to refer to infiltration and deposition of a matrix within a porous part or structure. The technique is particularly suitable for fabricating high temperature structural composites by depositing a carbonaceous or ceramic matrix within a carbonaceous or ceramic porous structure resulting in very useful structures such as carbon/carbon aircraft brake disks, and ceramic combustor or turbine components. The generally known CVI/CVD processes may be classified into four general categories: isothermal, thermal gradient, pressure gradient, and pulsed flow. See W. V. Kotlensky, *Deposition of Pyrolytic Carbon in Porous Solids*, 8 Chemistry and Physics of Carbon, 173, 190-203 (1973); W. J. Lackey, *Review, Status, and Future of the Chemical Vapor Infiltration Process for Fabrication of Fiber-Reinforced Ceramic Composites*, Ceram. Eng. Sci. Proc. 10[7-8]577, 577-81 (1989) (W. J. Lackey refers to the pressure gradient process as "isothermal forced flow").

In an isothermal CVI/CVD process, a reactant gas passes around a heated porous structure at absolute pressures as low as a few torr. The gas diffuses into the porous structure driven by concentration gradients and cracks to deposit a binding matrix. This process is also known as "conventional" CVI/CVD. The porous structure is heated to a more or less uniform temperature, hence the term "isothermal".

In a thermal gradient CVI/CVD process, a porous structure is heated in a manner that generates steep thermal gradients that induce deposition in a desired portion of the porous structure. The thermal gradients may be induced by heating only one surface of a porous structure, for example by placing a porous structure surface against a susceptor wall, and may be enhanced by cooling an opposing surface, for example by placing the opposing surface of the porous structure against a liquid cooled wall. Deposition of the binding matrix progresses from the hot surface to the cold surface.

In a pressure gradient CVI/CVD process, the reactant gas is forced to flow through the porous structure by inducing a pressure gradient from one surface of the porous structure to the opposing surface of the porous structure. Flow rate of the reactant gas is greatly increased relative to the isothermal and thermal gradient processes which results in increased deposition rate of the binding matrix. This process is also known as "forced-flow" CVI/CVD.

Finally, pulsed flow involves rapidly and cyclically filling and evacuating a chamber containing the heated porous structure with the reactant gas. The cyclical action forces the reactant gas to infiltrate the porous structure and also forces removal of the cracked reactant gas by-products from the porous structure.

The purpose of a CVI/CVD process as described herein is to deposit a binding matrix within a porous structure. This process adds mass to the parts, and increases part density. During a CVI/CVD process, there is a correlation between the increase in part weight, and the increase in part density. Under current state of the art, CVI/CVD run times are predetermined, based on the starting densities of the parts, and the anticipated time necessary to process them to a predetermined higher density. However, CVI/CVD runs are never exactly the same due to many variables, and likewise the results of the process vary from run to run. This means that parts may be either too dense, or not dense enough at the predetermined conclusion of a run.

In order to optimize furnace processing time and increase the yield of each run, a method is desired by which the weight change of the parts can be measured during the CVI/CVD process. If the weight change of the parts during the process is known, process parameters such as furnace temperature, reactant gas flow rate, internal furnace pressure and reactant gas reactivity, may be continuously adjusted to increase, decrease, or maintain the densification rate.

BRIEF SUMMARY

In one aspect, a method of chemical vapor infiltration and deposition includes stacking a number of porous structures in a stack in a furnace. The stack has a center opening region extending through the porous structures and an outer region extending along the porous structures. A first portion of a reactant gas is introduced to the center opening region. A second portion of the reactant gas is introduced to the outer region. The first portion and the second portion are controlled proportions thereby introducing predetermined portions of the reactant gas to both the center opening region and the outer region. The change in weight of the entire furnace, including contents, is measured during the chemical vapor infiltration and deposition process. The rate of weight change is monitored.

BRIEF DESCRIPTION OF THE DRAWINGS

FIG. 6 is a side view of one of the distributors.

FIG. 7 is a top plan view of the distributor.

FIG. 8 is a side cross section view of a cap.

FIG. 9 is a top plan view of the cap.

DETAILED DESCRIPTION

Figure 1:
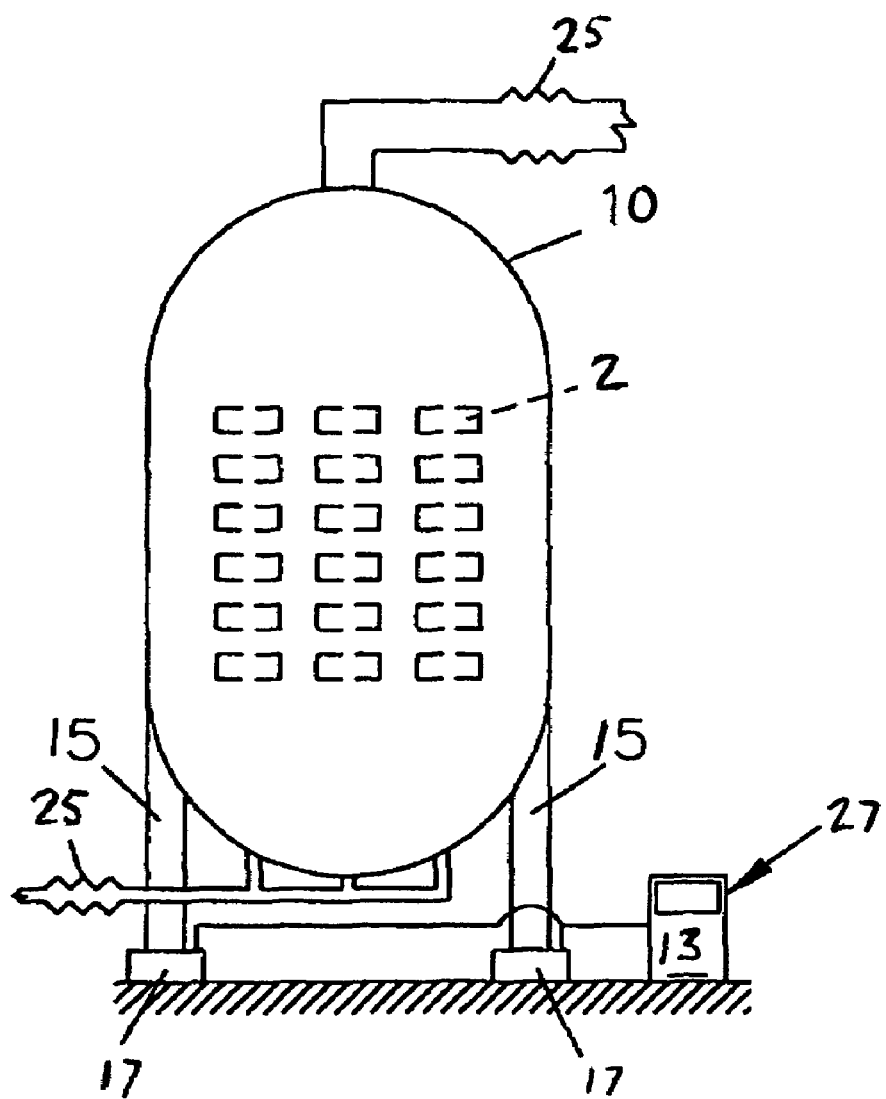
FIG. 1 is a depiction of a furnace on compression load cells.

Various aspects of the invention are depicted in FIG. 1, which is not to scale and in which like components are numbered alike. Referring now to FIG. 1, according to an aspect of the present invention, a furnace 10 for use in a CVI/CVD process, is disposed upon a weighing device 27, and the weighing device 27 is configured to indicate the weight of the furnace. According to a further aspect of the invention, the weighing device 27 is also configured to support the furnace. The weighing device 27 may be any device which is capable of being used to determine weight. The weighing device 27 depicted in FIG. 1 is the combination of a load cell 17 under each furnace leg 15, all connected to an indicator unit 13.

According to the present invention, a method to determine the weight change of parts 2 in a furnace 10 during a CVI/CVD process, comprises weighing the furnace 10, including contents, during the CVI/CVD process.

Also according to the present invention, the weight change of parts during the CVI/CVD process is monitored by attaching the furnace 10 to a means for weighing the furnace, electrically connecting an indicator unit 13 to the means for weighing the furnace, placing the parts 2 in the furnace for the CVI/CVD process, and monitoring the indicator unit 13 during the CVI/CVD process for the change in weight of the furnace 10 as the change in weight of the parts 2 therein. In a preferred embodiment of the invention, the means for weighing the furnace comprises placing the furnace on load cells. In a specific preferred embodiment the means for weighing the furnace comprises placing load cells 17 under the furnace 10, such that the weight of the furnace 10 is supported by the load cells 17. In FIG. 1 the load cells 17 are placed under each furnace leg 15.

In another preferred embodiment, the indicator unit 13 is tared immediately before the process is commenced, such that the indicator unit 13 reflects the change in weight of the parts. In any embodiment of the invention, all connections 25 to the furnace 10 may be flexible, to increase the accuracy of the weight measurement. Increasing the flexibility of the connections generally tends to increase the accuracy of the weight measurement.

According to a further aspect of the present invention, a CVI/CVD process is terminated based on the average weight gain per part. In a specific preferred embodiment, a CVI/CVD process comprises the steps of attaching the furnace 10 to a means for weighing the furnace, electrically connecting an indicator unit 13 to the means for weighing the furnace, placing the parts 2 in the furnace 10 for the CVI/CVD process, monitoring the indicator unit 13 during the CVI/CVD process for the change in weight of the furnace 10 as the change in weight of the parts 2 therein, and terminating the CVI/CVD process when the indicator unit 13 indicates that the parts 2 have gained a prescribed amount of weight. In a preferred embodiment of the invention, the means for weighing the furnace comprises placing the furnace 10 on load cells 17. In a specific preferred embodiment of this CVI/CVD process, the means for weighing the furnace comprises placing load cells 17 under the furnace 10, such that the entire weight of the furnace 10 is supported by the load cells 17. In FIG. 1 the load cells 17 are placed under each furnace leg 15.

In another preferred embodiment of this process, the indicator unit 13 is tared immediately before the process is commenced, such that the indicator unit 13 reflects the change in weight of the parts 2 directly. In any embodiment of this process, all connections 25 to the furnace 10 may be flexible, to increase the accuracy of the weight measurement.

According to another aspect of the invention, a method to determine the weight change of parts during a CVI/CVD process, comprises the steps of placing the furnace 10 on load cells 17 appropriate for the entire furnace 10 weight plus weight of the parts 2, attaching an indicator unit 13 to the compression load cells 17, placing the parts 2 in the furnace 10 for the CVI/CVD process, and monitoring the indicator unit 13 during the CVI/CVD process for the change in weight.

In another aspect of the invention, the apparatus for determining the weight change of parts 2 during a CVI/CVD process comprises load cells 17 supporting the furnace 10, and an indicator unit 13 electrically connected to the load cells 17.

According to a certain embodiment a furnace weighing 120,000 lbs to 150,000 lbs, is configured to process aircraft brake disks. All connections 25 to the furnace are flexible. One Flexmount Weight Module static strain gage with 45,000 lb capacity load cell manufactured by Mettler, Toledo and Co. is placed under each furnace leg 15. These load cells are electrically connected to an indicator unit 13, specifically a Jaguar System Integration Terminal (also manufactured by Mettler, Toledo and Co.) for a cumulative weight measurement such that one indicator unit 13 displays the total weight on all four load cells 17. Parts with an initial cumulative weight of on the order of a few percent of the furnace weight are then placed in the furnace, and the indicator unit 13 is tared. With this configuration, the weight gain measurement of the parts is accurate to within ±10% for parts having a lesser weight gain (total weight gain on the order of 1% of the total furnace weight), and is accurate to within ±5% for parts having a greater weight gain (total weight gain on the order of 3% of the total furnace weight). The weight gain measured according to the invention may be less than or equal to 10% of the total furnace weight, may be less than or equal to 5% of the total furnace weight, and may be less than or equal to 3% of the total furnace weight. Weight gains less than or equal to 1% of the total furnace weight have been measured with an accuracy within ±10%.

According to a further aspect of the invention, the process further comprises the step of monitoring the rate at which the parts gain weight, wherein the rate is influenced by process parameters including furnace temperature, reactant gas flow rate, internal furnace pressure, and reactivity of the reactant gas. The process may further comprise the step of varying at least one of the parameters to achieve a desired rate. For example, CVI/CVD deposition rate tends to decrease as matrix is deposited. It may be desirable to decrease the reactivity of the gas at a later stage in the process in order to promote infiltration of the gas into the parts. This may produce a greater overall weight gain. Other variations are possible.

Though shown vertical, the furnace 10 may be disposed in other orientations, and the weight of the furnace 10 may be measured in any manner suitable for the particular orientation.

As shown in FIGS. 2 through 5, a hardware assembly 32 with gas distributors 24 is provided for chemical vapor infiltration and deposition ("CVI/CVD") processes. The hardware assembly 32 is especially useful for carbon densification of annular porous structures 2 used for high performance brake disks 2 but is likely to be useful in many other applications for composite structures as well. Typically, the hardware assembly 32 supports and positions a number of brake disks 2 which are stacked on top of each other in a number of stacks 4. During the densification process, the hardware assembly 32 and stacks 4 of disks 2 are enclosed in a furnace 10 and hot hydrocarbon gases flow around and through the stacks 4 of brake disks 2, thereby depositing a carbon matrix within the interior regions and on the surface of the porous brake disk structures 2. A variety of processing parameters may be used to densify the porous structures 2, but an absolute gas pressure for the furnace 10 between 1 torr and 20 torr, a temperature range between 1,700° F. and 1,950° F., and a densification time between 150 hours and 500 hours is especially suited for manufacturing aircraft brake disks 2. A variety of gas mixtures may also be used, but a gas mixture of 87% natural gas and 13% propane or a range of 80% to 100% natural gas and 20% to 0% propane is especially suited for manufacturing aircraft brake disks.

A number of different types of furnaces 10 may be used for CVI/CVD processes. Commonly, an induction furnace 10 is used that includes furnace walls 12 that enclose the hardware assembly 32 and the stacks 4 of brake disks 2. The furnace 10 also includes inlet ducts 14 and outlet ducts 16 for introducing and exhausting the gas mixture into and out of the furnace 10. A preheater 18 is also commonly provided within the furnace 10 to heat the gas before the gas is directed to the porous structures 2. Typically, the preheater 18 is sealed and the incoming gas from the inlet ducts 14 is received by the preheater 18 before being introduced to the hardware assembly 32. The preheated gas is then discharged from the preheater 18 through discharge openings 20 in the furnace floor plate 22 of the preheater 18.

At least one distributor 24 is provided at the preheater discharge openings 20 for controlling the flow of gas around the stacks 4 of brake disks 2. Preferably, the distributors 24 are removably mounted between the floor plate 22 of the preheater 18 and the base plate 46 of the bottom hardware assembly modules 34. To aid installation of the distributors 24, recessed areas 19, 45 with guide diameters 21, 47 are provided in both the top surface of the floor plate 22 and the bottom surface of the hardware assembly base plate 46. The recessed areas 19 in the floor plate 22 are generally concentric with each of the discharge openings 20, and the recessed areas 45 in the hardware assembly base plate 46 are generally concentric with each of the inlet openings 53. Therefore, the distributors 24 may be easily installed by inserting the outer diameter 26 of each distributor 24 into one of the guide diameters 21 in the floor plate 22 and one of the guide diameters 47 in the base plate 46.

The distributor 24 (also shown in FIGS. 6 and 7) divides the gas from the preheater 18 into at least two different portions and directs the portions in different directions. Accordingly, the distributor 24 includes an axial hole 28 that extends longitudinally through the distributor 24. Thus, a first portion of gas flows through the axial hole 28 from the preheater discharge opening 20 to the hardware assembly inlet opening 53. The distributor 24 also includes a number of radial holes 30 that extend out from the axial hole 28 to the outer diameter 26 of the distributor 24. Thus, a second portion of gas flows out of the distributor 24 through the radial holes 30 to the space between the floor plate 22 and the bottom base plate 46. Other equivalent passageways, such as grooves or the like, formed into the floor plate 22, the bottom base plate 46, the distributor 24, or other hardware member may also be used in place of the radial holes 30. In one exemplary embodiment, the first portion that flows through the inlet opening 53 of the bottom base plate 46 represents about 76% of the gas mixture, and the second portion that flows out through the radial holes 30 represents about 24% of the gas mixture. In this embodiment, the first gas flow portion is restricted by the inlet opening 53, which is about 5 inches in diameter, in the bottom base plate 46. The second gas flow portion is then restricted by the radial holes 30, which consist of eight holes about 1 inch in diameter. Other proportions for the first portion and second portion may also be advantageous, and other sizes and placement of the inlet opening 53, axial hole 28 and radial holes 30 may be used. For example, the range of flow through the inlet opening may be as low as 20% to as much as 80%, while the range of flow into the space between the floor plate 22 and the bottom base plate 46 may be as high as 80% to as low as 20%. Typically, the preferred embodiment uses a proportion of about 80% for the first portion and about 20% for the second portion, but proportions between 70% and 90% for the first portion and 30% to 10% for the second portion and between 60% to 80% for the first portion and 40% to 20% for the second portion, or vice versa, may be used.

Figure 2:
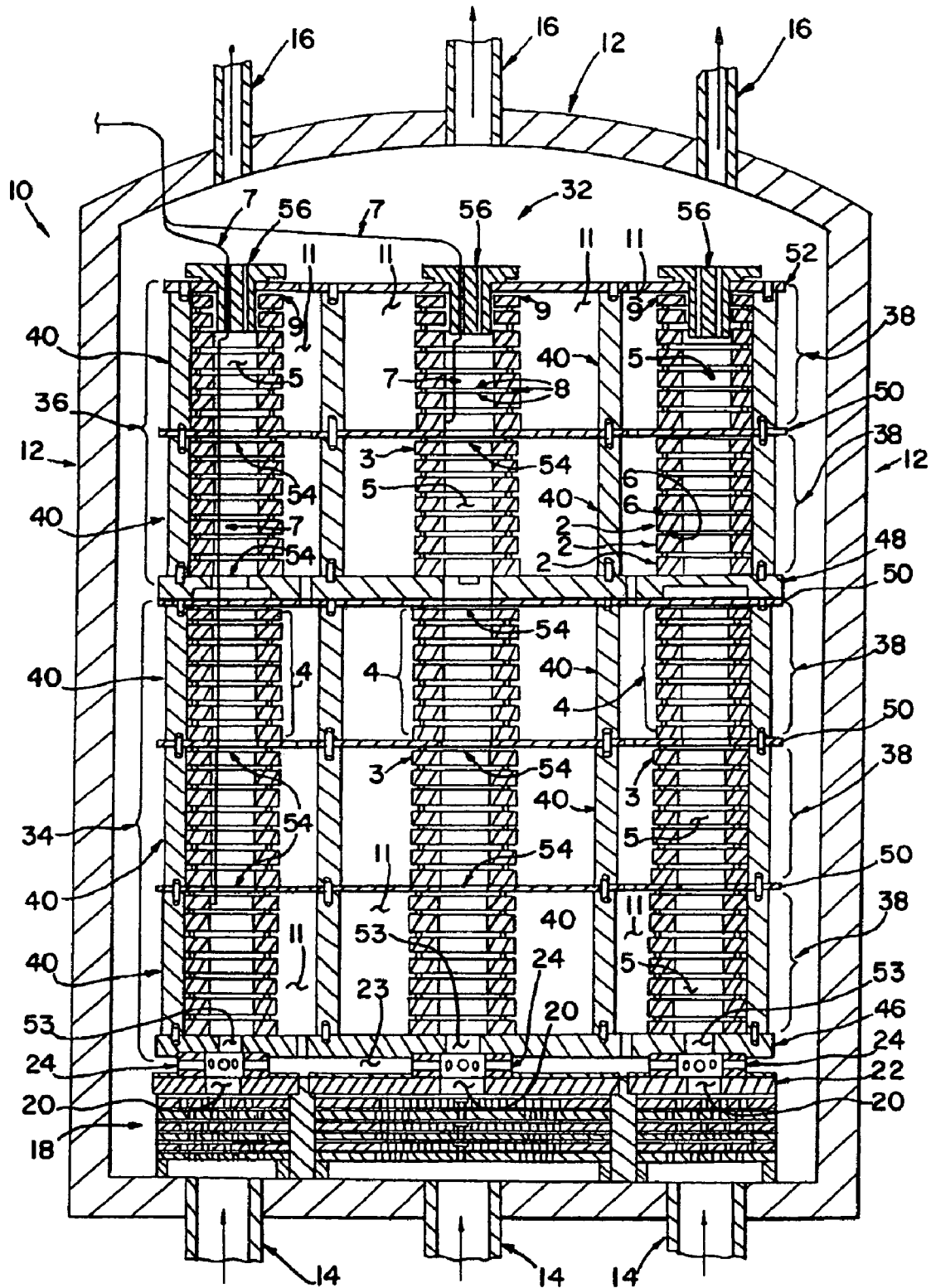
FIG. 2 is a side cross sectional view of a furnace, showing a hardware assembly.
Figure 3:
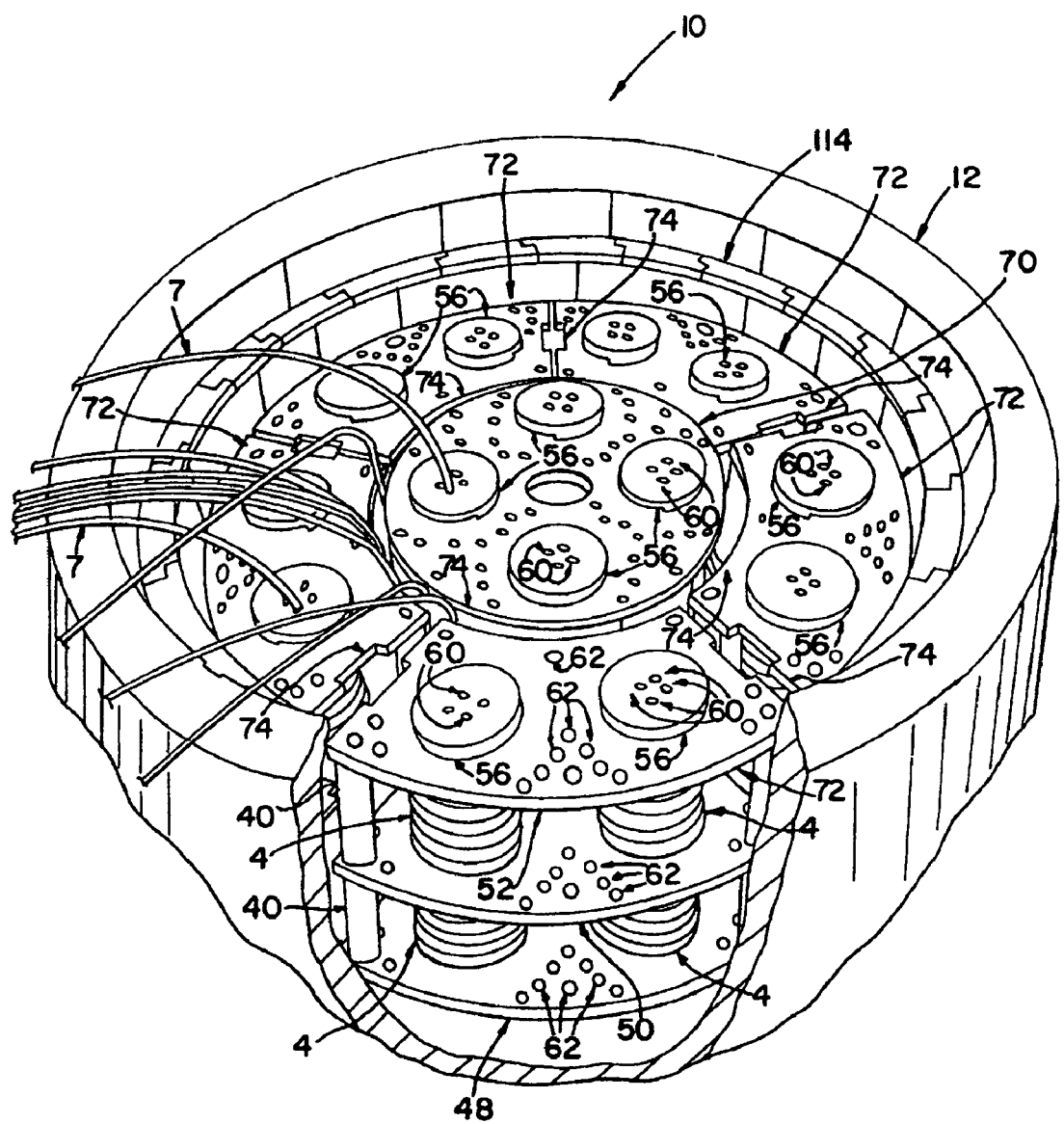
FIG. 3 is a perspective view of the furnace, showing the top of the furnace open and a portion of the furnace wall broken away to show the hardware assembly.
Figure 4:
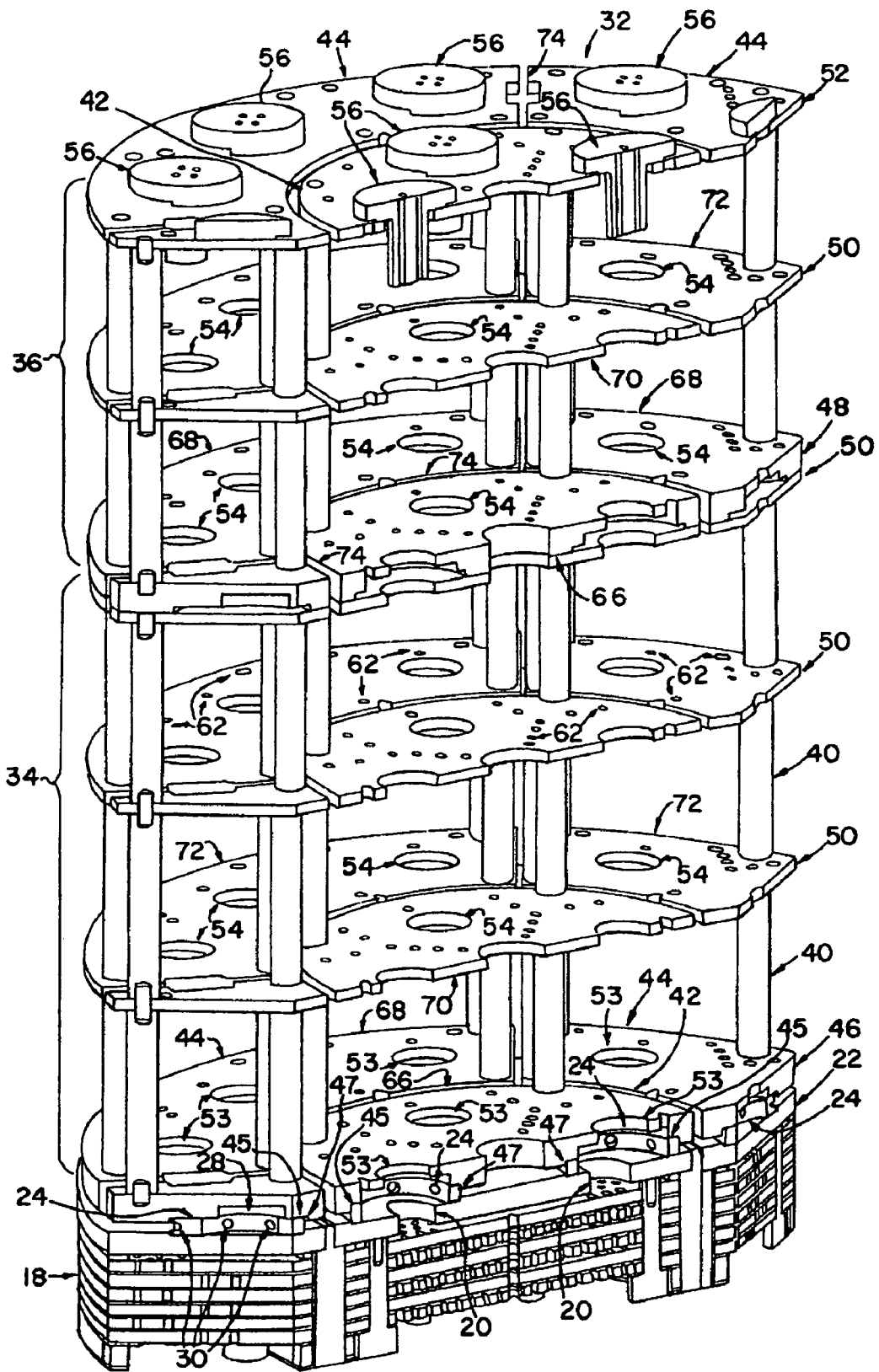
FIG. 4 is a perspective view of a hardware assembly similar to the hardware assembly shown in FIG. 3.
Figure 5:
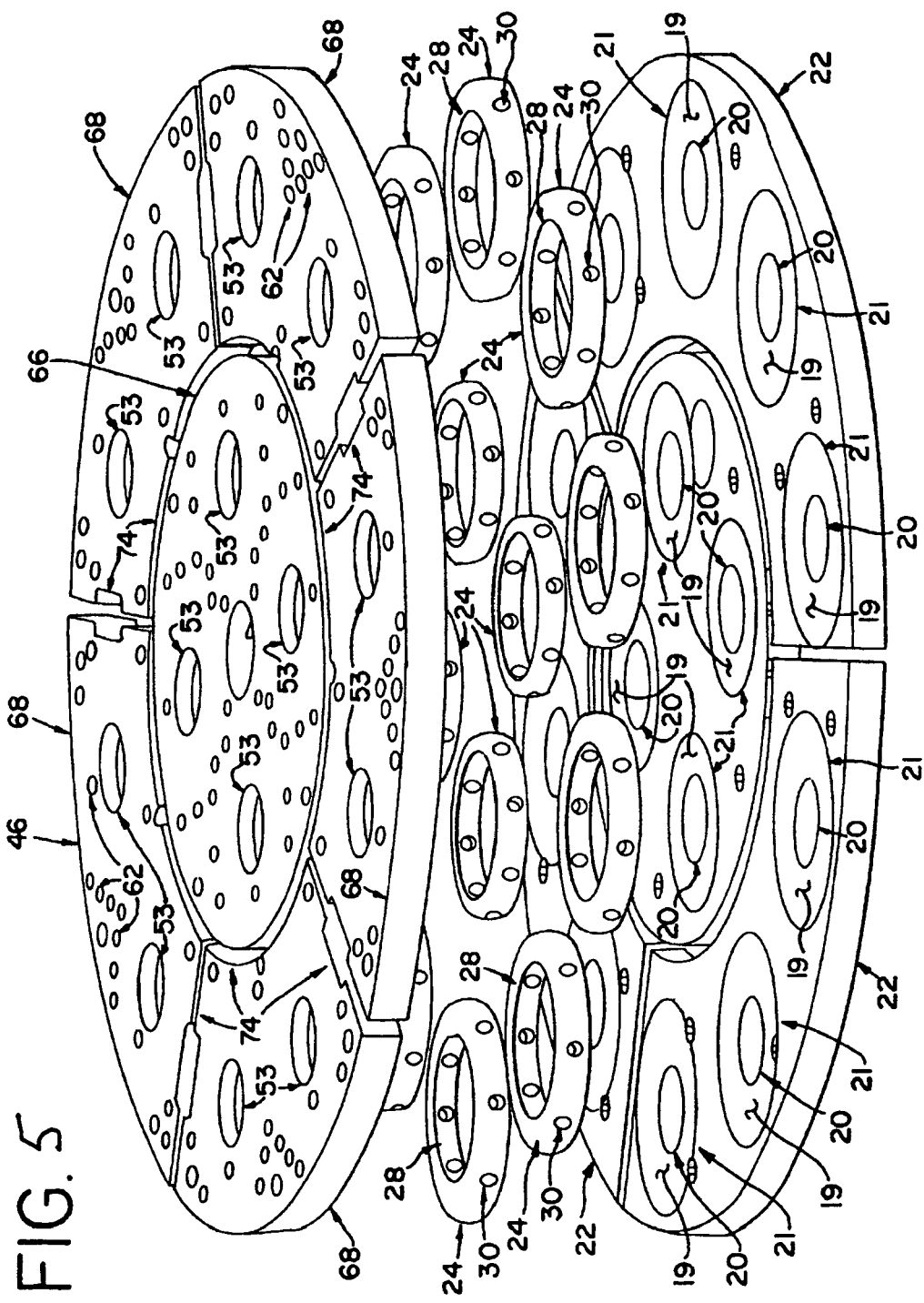
FIG. 5 is an exploded perspective view of a furnace floor plate, a number of distributors and a hardware assembly base plate.

A typical hardware assembly 32 preferably consists of a number of separate modules 34, 36 to make assembly, disassembly, loading and unloading of the hardware assembly 32 easier. Accordingly, as shown in FIG. 2, the hardware assembly 32 includes a bottom set of modules 34 with three units 38. A unit 38 usually refers to the area between an adjacent base plate 46, 48 and a support plate 50 or between adjacent support plates 50, 52 where one level of brake disk stacks 4 is supported. Support posts 40 separate the base plates 46, 48 and support plates 50, 52, thereby forming each unit 38. The hardware assembly 32 also includes a top set of modules 36 similar to the bottom set 34 with two units 38. As shown in FIG. 3, the top and bottom sets of modules 34, 36 also include a center module 42 with typically four stacks 4 of brake disks 2 and a number of arc-shaped outer modules 44 with two or more stacks 4 of brake disks 2 each, although different configurations may be used. Accordingly, each of the modules 34, 36, 42, 44 may be loaded into the furnace 10 one at a time, leaving approximately 1 inch gaps 74 between the outer modules 44 and between the outer modules 44 and the center modules 42. Typically, the base plates 46, 48 and support plates 50, 52 are usually referred to as single base plates 46, 48 and single support plates 50, 52 for simplicity even though the base plates 46, 48 include separate center plates 66 and outer plates 68 and the support plates 50, 52 include similar separate center plates 70 and outer plates 72. Preferably, each of the components of the hardware assembly 32 and the distributor 24 are made from a graphite (e.g., HTM or HLM graphite) material that is compatible with typical CVI/CVD processes used for manufacturing carbon/carbon brake disks 2.

The porous brake disk structures 2 are loaded into the hardware assembly 32 in stacks 4, with each brake disk 2 being separated from adjacent brake disks 2 with spacers 6 about 0.125 to 1.0 inch thick. Therefore, open passages 8 are formed between adjacent brake disks 2. Similarly, the top brake disk 3, 9 in each unit 38 is spaced about 0.125 to 1.0 inch from the bottom surface of the adjacent support plate 50, 52 to form another open passage 8. The stacks 4 of porous brake disk structures 2 are also positioned within the hardware assembly 32 with the center openings 5 of the annular brake disks 2 coaxial with the inlet openings 53 in the bottom base plate 46 and with the transfer openings 54 in the support plates 50 and top base plate 48.

Caps 56 (also shown in FIGS. 8 and 9) are installed into the transfer openings 54 of the top support plate 52 of the top module 36 in order to restrict gas flow through the top of the stacks 4. Each of the caps 56 include an extended portion 58 that extends down into the center openings 5 of the top brake disks 9. Four longitudinal holes 60 are also provided through the caps 56 to allow some gas flow to escape upward from the center openings 5 of the stacks 4. Thermocouple wires 7 may also be routed through the holes 60 in the caps 56 and down through the center openings 5 in the stacks 4. The thermocouple wires 7 are then connected to thermocouples embedded in sample brake disks (not indicated) at various heights in the stacks 4 to measure the representative temperature of the brake disks 2.

It is now apparent that the gas flow through the hardware assembly 32 is more uniform and beneficial compared to other densification processes. Thus, higher quality parts (i.e., with a more uniform and more desirable microstructure) may be produced with lower manufacturing costs. Accordingly, a gas mixture is supplied to the inlet ducts 14, while a vacuum is produced at the outlet ducts 16. The gas is then drawn through the preheater 18, thereby raising the temperature of the gas. Next, the gas exits the preheater 18 through the discharge openings 20 in the floor plate 22, thereby passing into the axial hole 28 of each of the distributors 24. The gas is then separated into a first portion of about 76% of the gas and a second portion of about 24% of the gas. The first portion passes through the axial hole 28 in the distributor 24 and through the inlet opening 53 in the hardware assembly base plate 46. The second portion passes out through the radial holes 30.

The first portion of gas passes up through the center opening region 5 in the stacks 4 of annular porous structures 2. The gas passes to adjacent stacks 4 in the adjacent units 38 through the transfer openings 54 in the support plates 50 and the top base plate 48. The gas also passes out from the center opening region 5 through the open passages 8 between the adjacent brake disks 2. A controlled pressure is maintained in the center opening region 5 by the caps 56 which block and restrict the gas from completely flowing out from the center opening 5 in the top brake disk 9 of the hardware assembly 32. However, some gas flow is permitted through the center opening 5 of the top brake disk 9 to avoid stagnation of the gas near the top of the stacks 4. Accordingly, some gas flows out through the longitudinal holes 60 in each of the caps 56, and some gas flows out the open passage 8 between the top brake disk 9 and the top support plate 52.

The second portion of gas exits the radial holes 30 in the distributor 24 and passes to the open space 23 between the floor plate 22 and the hardware assembly base plate 46. The gas then passes up into the hardware assembly 32 through passage holes 62 in the center plate 66 and the outer plates 68 of the bottom base plate 46. The gas also passes up through the gaps 74 between the center plate 66 and the outer plates 68 and between each of the outer plates 68. Thus, the gas passes up along the outer region 11 around the outer surfaces of the stacks 4. The gas passes through the units 38 by passing through passage holes 62 and gaps 74 in the support plates 50 and the top base plate 48. As the second portion of gas passes up through the hardware assembly 32, it combines with the first portion of gas from the center opening region 5 as the gas passes out through the open passages 8. When the gas reaches the top of the hardware assembly 32, the gas passes out of the hardware assembly through passage holes 62 and gaps 74 in the top support plate 52. Both portions of gas then exit the furnace 10 through the outlet ducts 16. Thus, it is apparent that the hardware assembly 32 and distributor 24 minimize gas stagnation zones. Therefore, the related problems typically associated with gas stagnation zones are avoided, such as soot and other oily substance accumulations, seal-coating, nonuniform carbon deposition and undesirable microstructures.

Figure 10:
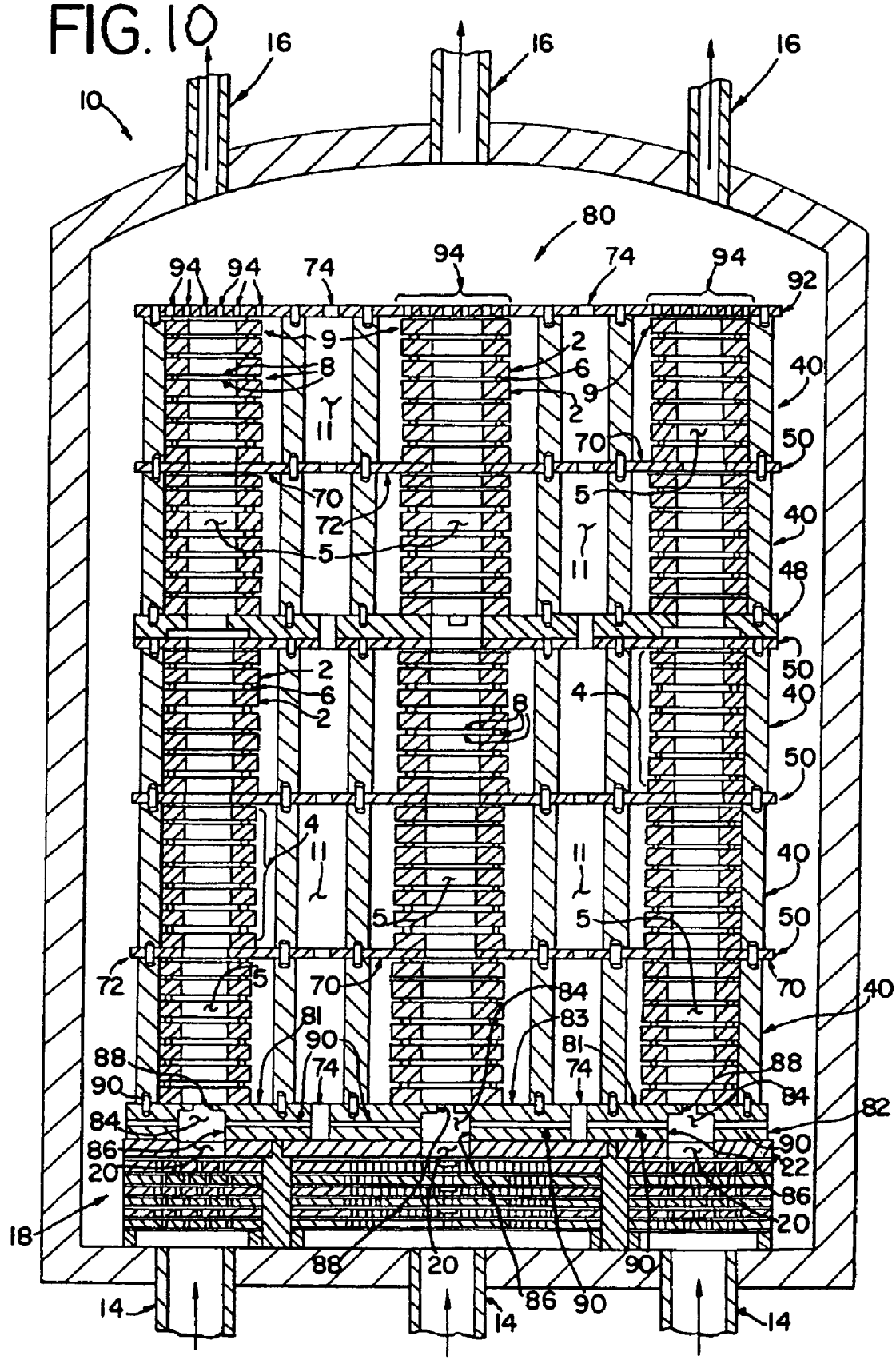
FIG. 10 is a side cross sectional view of a furnace, showing an alternative hardware assembly.

As shown in FIG. 10, the flow of gas through the hardware assembly 80 may also be controlled between a first portion and a second portion without using the distributors 24 and caps 56. In this alternative arrangement, the bottom base plate 82 rests directly on top of the furnace floor plate 22. The inlet openings 84 include a lower, larger diameter hole 86. The radial holes 90 extend through the base plate 82 from the lower, larger diameter holes 86 to the gaps 74 between the outer base plates 81 and between the outer base plates 81 and the center base plate 83 and to the outer edge of the outer base plates 81. Small holes 94 are also provided through the top support plate 92.

The gas flow through the alternative hardware assembly 80 is now apparent. Like the hardware assembly 32 previously described, the hot reactant gas enters through the inlet ducts 14 and passes through the preheater 18. The gas then exits the preheater 18 through the discharge openings 20 and passes directly into the lower, larger diameter hole 86 of the inlet opening 84. Next, a first portion of gas passes through the upper, smaller diameter hole 88 in the inlet opening 84. A second portion of gas also passes through the radial holes 90. Accordingly, as previously described with respect to the first hardware assembly 32, the first portion of gas then passes up through the center opening region 5, while the second portion of gas passes up along the outer region 11. As the first portion of gas passes up through the center opening region 5, most of the first portion passes out to the outer region 11 through the open passages 8 between adjacent brake disks 2 and commingles with the second portion. Some of the first portion, however, passes up through the entire center opening region 5 and exits the hardware assembly 80 through the small holes 94 in the top support plate 92. The remaining commingled gas then exits the hardware assembly 80 through the gaps 74 between the plates 70, 72 and along the outside of the hardware assembly 80.

Figure 11:
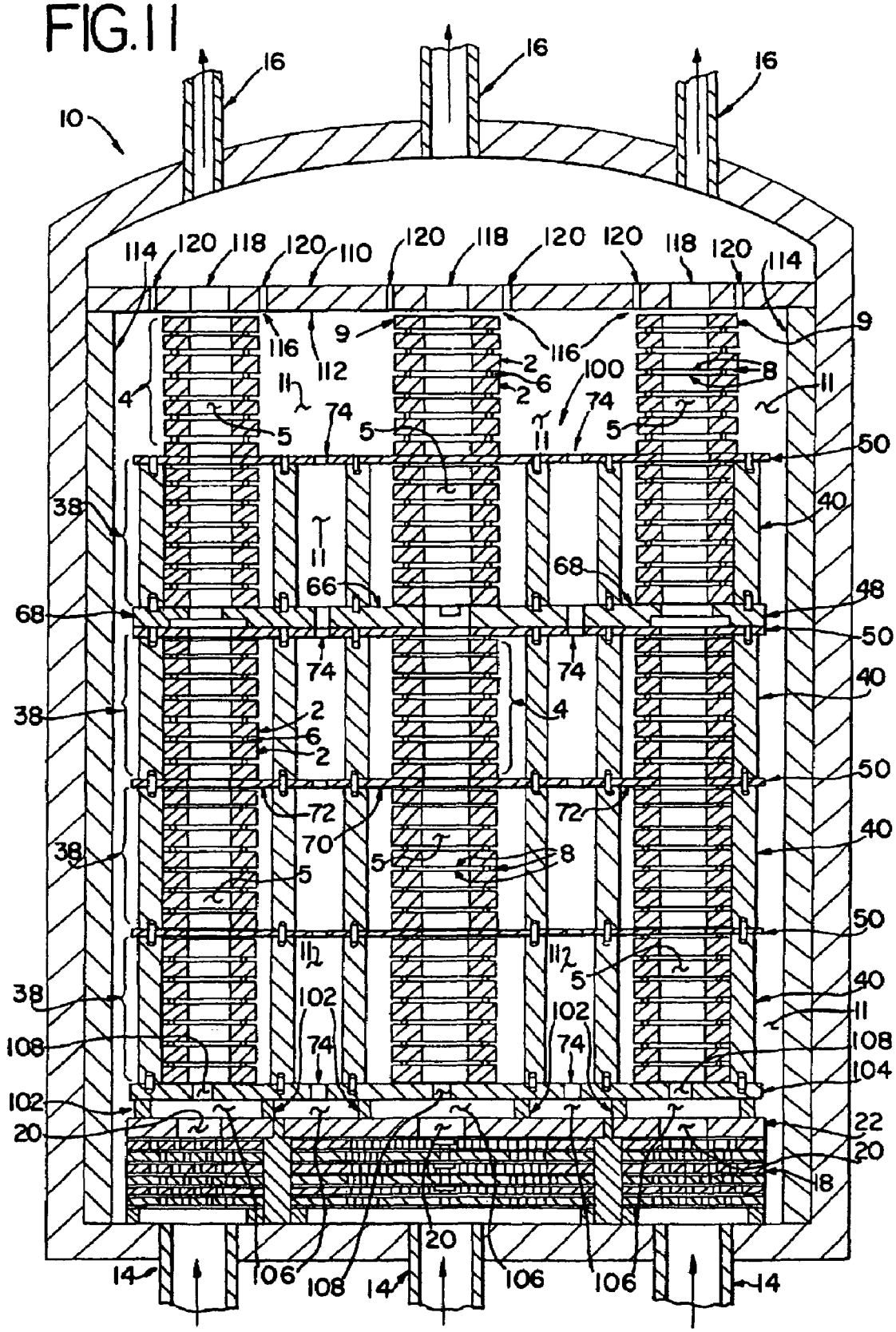
FIG. 11 is a side cross sectional view of a furnace, showing another alternative hardware assembly.

Turning now to FIG. 11, another alternative hardware assembly 100 is shown for flowing most of the gas from the outer region 11 to the center opening region 5. In this hardware assembly 100, spacers 102 are provided between the floor plate 22 and the bottom base plate 104. The spacers 102 may be round or square members and do not restrict gas flow through the space 106 between the floor plate 22 and the bottom base plate 104. The inlet openings 108 in the bottom base plate 104 are also smaller in size than the discharge openings 20 in the floor plate 22 to restrict flow through the inlet openings 108.

If desired, the top unit 38, which is shown in the previous hardware assemblies 32, 80, may be removed in this alternative hardware assembly 100. The top stack 4 of brake disks 2 is then stacked so that the top brake disk 9 is spaced away from the bottom surface 112 of the susceptor lid 110 with an open passage 116 therebetween. Preferably, the open passage 116 is no more than 1 inch wide although larger widths may also be used. Spacer rings, well known to those in the art, may be used to achieve a desired width for the open passage 116. Exit holes 118 are provided through the susceptor lid 110, or comparable plate, directly above each of the stacks 4. Small holes 120 through the susceptor lid 110 may also be provided away from the exit holes 118. The susceptor lid 110 is supported by and sealed to the susceptor walls 114 (the susceptor walls 114 and susceptor lid 110 are not shown in FIGS. 2 and 10 for simplicity).

It is now apparent that in the alternative hardware assembly 100 most of the gas flows from the outer region 11 towards the center opening region 5 instead of from the center opening region 5 towards the outer region 11 as described in the previous hardware assemblies 32, 80. Like the previous hardware assemblies 32, 80, hot reactant gas enters through the inlet ducts 14 and passes through the preheater 18. The gas then exits the preheater 18 through the discharge openings 20 and passes into the space 106 between the floor plate 22 and the bottom base plate 104. Most of the gas flows as a second portion through the space 106 between the floor plate 22 and the bottom base plate 104. The second portion then flows up through the hardware assembly 100 along the outer region 11. The second portion passes through the units 38 by passing through the passage holes 62 (see FIG. 3) and the gaps 74 in the base plates 66, 68 and support plates 70, 72 as previously described. On the other hand, some of the gas flows as a first portion through the inlet openings 108. The first portion then flows up through the center opening region 5. As the first and second portions pass upwards, some of the second portion passes through the open passages 8 between adjacent brake disks 2 towards the center opening region 5, thus commingling with the first portion of gas. The remaining second portion in the outer region 11 passes through the open passage 116 between the top brake disk 9 and the bottom surface 112 of the susceptor lid 110. When the small holes 120 are not provided, the entire first and second portions then pass through the exit holes 118 in the susceptor lid 110 and out through the outlet ducts 16. On the other hand, when the small holes 120 are provided, some of the second portion passes out through the small holes 120, while the rest of the second portion passes through the exit holes 118. A number of proportions for the first and second portions may be used, including 85% for the second portion and 15% for the first portion, a range of 65% to 85% for the second portion and 35% to 15% for the first portion, or other proportions previously described.

Accordingly, one advantage of the hardware assemblies 32, 80, 100 is that successive densification processes may flow reactant gas in opposite directions, that is, from the center opening region 5 to the outer region 11 in one densification process and from the outer region 11 to the center opening region 5 in another densification process. As is well understood by those in the art, densification of porous structures typically involves several successive densification processes. Sometimes, the processing parameters, such as the gas mixture, temperature and pressure, are varied during each of the successive processes in order to optimize the quality of the finished densified product. Machining operations may also be performed on the structures between densification processes.

Figure 12:
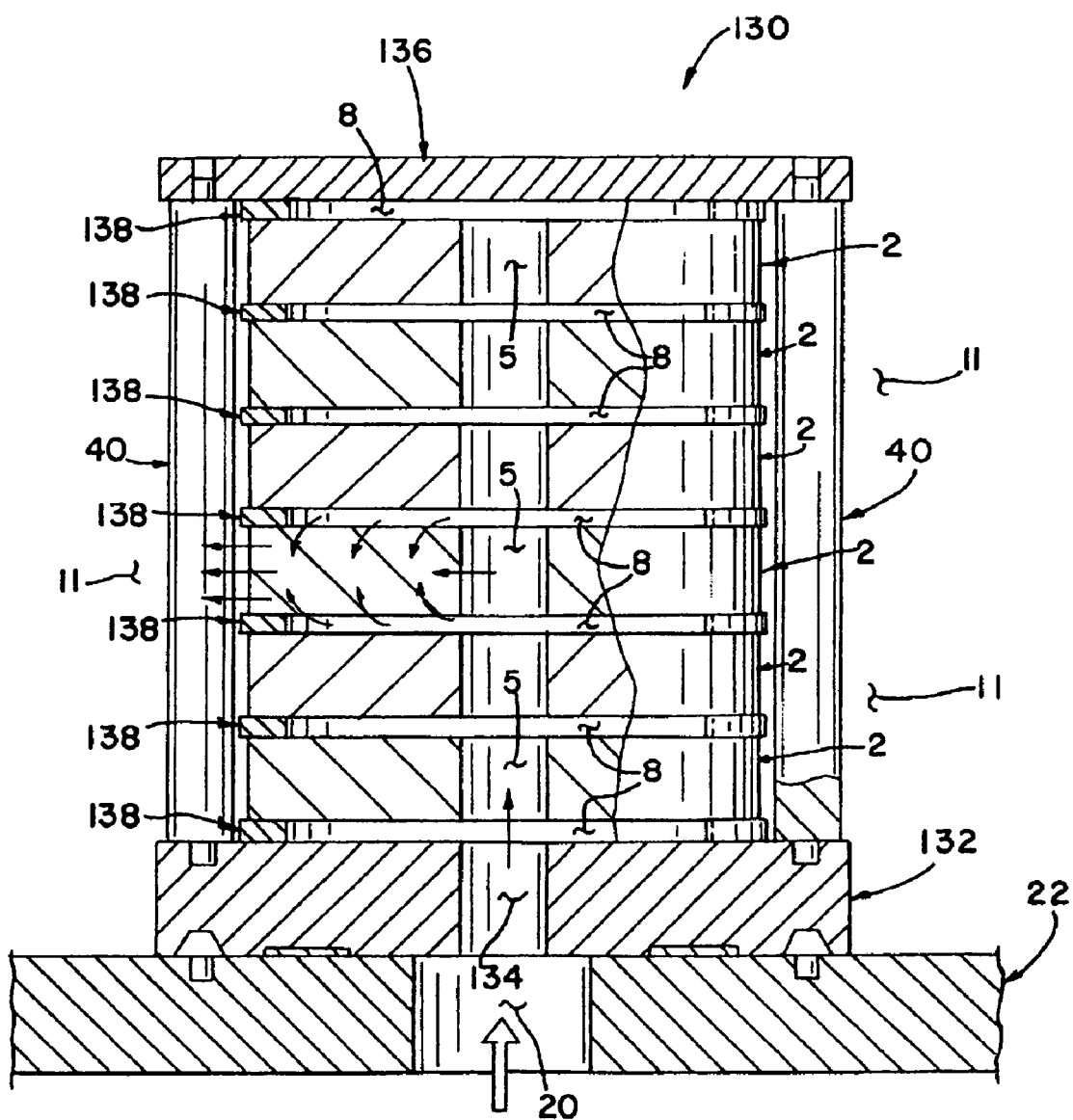
FIG. 12 is a side cross sectional view of a hardware assembly for a rapid densification process.

One way that has been discovered to improve the quality of densification is to reverse the direction of gas flow from prior densification processes. This may be achieved, for example, by using one of the hardware assemblies 32, 80 shown in FIGS. 2 and 10 in a first densification process and then using the hardware assembly 100 shown in FIG. 11 in a second densification process. Thus, in the first process most of the gas flows from the center opening region 5 towards the outer region 11, and in the second process most of the gas flows oppositely from the outer region 11 towards the center opening region 5. The processes may also be reversed to flow the gas from the outer region 11 to the center opening region 5 in the first process and from the center opening region 5 to the outer region 11 in the second process. Additional benefits may be achieved by combining a densification process using one of the hardware assemblies 32, 80, 100 with a rapid densification process, or sometimes referred to as a pressure gradient CVI/CVD process, where the open passages 8 are sealed to restrict gas flow. As shown in FIG. 12, a typical hardware assembly 130 for a rapid densification process includes a base plate 132 with an inlet opening 134. The top of the hardware assembly 130 is sealed with a top plate 136. The open passages are then also sealed with spacer rings 138. Therefore, the reactant gas is forced to flow through the interior region of the brake disks 2 from the center opening region 5 to the outer region 11 or vice versa. Accordingly, a rapid densification process that flows the gas from the center opening region 5 to the outer region 11 may be combined with the hardware assembly 100 shown in FIG. 11 which flows the gas in reverse from the outer region 11 to the center opening region 5. This combination decreases the total time required to completely densify a product while providing a high quality of densification. As previously described, the reactant gas may also be separated into first and second portions that flow separately to the center opening region 5 and the outer region 11 in either one or both of the first and second densification processes. Moreover, substantially all of the reactant gas may flow from the center opening region 5 to outer region 11, or vice versa, in either one or both of the first and second densification processes.

While a preferred embodiment of the invention has been described, it should be understood that the invention is not so limited, and modifications may be made without departing from the invention. The scope of the invention is defined by the appended claims, and all devices that come within the meaning of the claims, either literally or by equivalence, are intended to be embraced therein.

What is claimed is:

1. A method of chemical vapor infiltration and deposition, comprising
   stacking a number of porous structures in a stack in a furnace, wherein the stack has a center opening region extending through the porous structures and an outer region extending along the porous structures;
   introducing a first portion of a reactant gas to the center opening region;
   introducing a second portion of the reactant gas to the outer region, wherein the first portion and the second portion are controlled proportions thereby introducing predetermined portions of the reactant gas to both the center opening region and the outer region;
   measuring the change in weight of the entire furnace, including contents, during the chemical vapor infiltration and deposition process; and
   monitoring the rate of weight change.

2. The method of claim 1 further comprising monitoring the furnace temperature and changing the furnace temperature to achieve a desired weight gain.

3. The method of claim 2 wherein the furnace temperature is between about 1,700°F. to 1,950° F.

4. The method of claim 1 further comprising monitoring the reactant gas flow into the furnace and changing the reactant gas flow to achieve a desired weight gain.

5. The method of claim 1 further comprising monitoring the internal furnace pressure and changing the internal furnace pressure to achieve a desired weight gain.

6. The method of claim 5 wherein the internal furnace pressure is between about 1 torr and 25 torr.

7. The method of claim 1 further comprising monitoring the reactivity of the reactant gas and changing the reactant gas flow to achieve a desired weight gain.

8. The method of claim 7, wherein the reactant gas is a mixture of hydrocarbon gases with between about 80% to 100% natural gas and between about 20% to 0% propane.

9. The method of claim 1, wherein the first portion is between about 15% to 80% of the reactant gas and the second portion is between about 85% to 20% of the reactant gas.

10. The method of claim 1, wherein the first portion is between about 15% to 35% of the reactant gas and the second portion is between about 85% to 65% of the reactant gas.

11. The method of claim 1, further comprising heating the reactant gas to a temperature between about 1,700° F. to 1,950° F., depressurizing the reactant gas to a pressure between about 1 torr and 25 torr, and maintaining the temperature and the pressure between about 150 hours to 500 hours.

12. The method of claim 1, wherein the reactant gas is a mixture of hydrocarbon gases with between about 80% to 100% natural gas and between about 20% to 0% propane.

13. The method of claim 1, further comprising spacing the annular porous structures apart thereby forming open passages therebetween and passing at least some of one of the first and second portions of the reactant gas between the center opening region and the outer region through the open passages.

14. The method of claim 1, further comprising blocking at least a portion of the center opening region at one end of the stack, passing at least some of the first portion of the reactant gas out of the center opening region through a hole at the blocked end, and passing at least some of the second portion of the reactant gas out of the outer region without passing to the center opening region.

15. The method of claim 1, further comprising spacing one of the annular porous structures at one end of the stack away from a blocking plate thereby forming an open passage therebetween and passing at least some of the first portion of the reactant gas from the center opening region to the outer region through the open passage.

16. The method of claim 1, further comprising spacing one of the annular porous structures at one end of the stack away from a blocking plate thereby forming an open passage therebetween and passing at least some of the second portion of the reactant gas from the outer region to the center opening region through the open passage.

17. The method of claim 1, further comprising spacing the annular porous structures apart thereby forming open passages therebetween and passing at least some of the first portion of the reactant gas from the center opening region to the outer region through the open passages; and wherein the first portion is between about 60% to 80% of the reactant gas and the second portion is between about 40% to 20% of the reactant gas.

18. The method of claim 1, further comprising spacing the annular porous structures apart thereby forming open passages therebetween and passing at least some of the second portion of the reactant gas from the outer region to the center opening region through the open passages; and wherein the first portion is between about 15% to 35% of the reactant gas and the second portion is between about 85% to 65% of the reactant gas.

19. The method of claim 1, in combination with a prior densification process, wherein the prior densification process comprises passing a reactant gas between a prior center opening region and a prior outer region, and wherein the method further comprises passing most of one of the first and second portions of the reactant gas between the center opening region and the outer region in an opposite direction to that of the prior densification process.

* * * * *